US007477114B2

(12) United States Patent
Pivit et al.

(10) Patent No.: US 7,477,114 B2
(45) Date of Patent: Jan. 13, 2009

(54) 3DB COUPLER

(75) Inventors: Erich Pivit, Allmersbach in Tal (DE); Michael Glück, Freiburg (DE)

(73) Assignee: HUETTINGER Elektronik GmbH + Co. KG, Freiburg (DE)

( * ) Notice: Subject to any disclaimer, the term of this patent is extended or adjusted under 35 U.S.C. 154(b) by 324 days.

(21) Appl. No.: 11/368,314

(22) Filed: Mar. 3, 2006

(65) Prior Publication Data

US 2006/0197629 A1 Sep. 7, 2006

Related U.S. Application Data

(60) Provisional application No. 60/675,852, filed on Apr. 29, 2005.

(30) Foreign Application Priority Data

Mar. 5, 2005 (EP) ................................. 05004860

(51) Int. Cl.
*H03H 7/38* (2006.01)

(52) U.S. Cl. ........................ 333/112; 333/109; 333/115

(58) Field of Classification Search ................. 333/109, 333/112, 115–119
See application file for complete search history.

(56) References Cited

U.S. PATENT DOCUMENTS 4,012,703 A * 3/1977 Chamberlayne .......... 333/24 R
4,499,441 A 2/1985 Lynch et al.
5,818,308 A * 10/1998 Tanaka et al. ............... 333/116
5,892,668 A * 4/1999 Okamoto et al. .............. 363/40
6,049,258 A * 4/2000 Fawal et al. ................. 333/177
6,438,000 B1 * 8/2002 Okamoto et al. .............. 363/40
6,515,556 B1 * 2/2003 Kato et al. .................. 333/116
6,806,789 B2 10/2004 Bawell et al.
7,236,080 B2 * 6/2007 Kyriazidou et al. ......... 336/200
2003/0025573 A1 2/2003 Pchelnikov et al.
2003/0218513 A1 11/2003 Komai et al.
2004/0207482 A1 10/2004 McAndrew et al.

FOREIGN PATENT DOCUMENTS

EP 0 715 392 6/1996
EP 0 456 212 10/1996

OTHER PUBLICATIONS

European Search Report from corresponding priority application EP 05 00 4860, dated Jun. 21, 2005.
Office action from corresponding European Patent Application No. 05 004 860.2 (3 pages) with English translation (2 pages).

* cited by examiner

*Primary Examiner*—Benny Lee
*Assistant Examiner*—Kimberly E Glenn
(74) *Attorney, Agent, or Firm*—Fish & Richardson P.C.

(57) ABSTRACT

A 3 dB coupler includes at least one first and one second electric conductor that are spaced apart from each other and are capacitively and inductively coupled to each other in a coupling region. The first conductor represents the primary side of a transformer, and the second conductor represents the secondary side of the transformer. The first and second conductors each have a winding number of n>1.

37 Claims, 3 Drawing Sheets

3DB COUPLER

CROSS REFERENCE TO RELATED APPLICATIONS

This application claims priority under 35 U.S.C. §119(a) to EP 05 004 860.2, filed Mar. 5, 2005, and to U.S. Application No. 60/675,852, filed Apr. 29, 2005. Both of these applications are hereby incorporated by reference in their entirety.

TECHNICAL FIELD

The application relates to a 3 dB coupler.

BACKGROUND

Radio frequency amplifiers with the common industrial frequencies of 13.56 MHz and 27.12 MHz and output powers of 1 kW to 50 kW are conventionally used in the field of laser excitation or plasma processes.

Load impedances of laser excitation or plasma processes can be non-linear and dynamic, exhibiting unpredictable changes. These dynamic impedance changes may generate reflections that produce losses in the radio frequency amplifier. Large reactive energies that are stored in the reactive elements of the radio frequency amplifiers, in the feed lines, and in the reactive elements of matching networks can thereby be discharged. Such discharge may generate high voltages or currents, may excite oscillations in the radio frequency amplifier, or may destroy components of the radio frequency amplifier. Such load impedance changes may occur, for example, during striking of the laser excitation or plasma processes, or during arcing in the plasma process.

Radio frequency-operated laser excitations and, to an increasing extent, also radio frequency-excited plasma processes can be operated in a pulsed manner, i.e., the radio frequency amplifiers are switched on and off with pulse frequencies of, for example, 100 Hz to 300 kHz, or are switched between two power ranges. Temporary reflections may be produced during each switching process, and these temporary reflections may be converted into lost energy, that may accumulate as excess heat in the radio frequency amplifiers.

The output stages of such radio frequency amplifiers may be realized with transistors for small powers (1-6 kW). Alternatively, for larger power, tubes may be used as output stages of radio frequency amplifiers. Tubes can be more robust to unwanted reflections and can dissipate lost energy better than transistors. Tubes can be, however, more expensive than transistors, can be subject to wear during operation, and can be relatively large. Tube radio frequency amplifiers can be bundled together with a drive circuit and a cooling system in switching cabinets of a size of approximately 0.8 m×1 m×2 m.

SUMMARY

In one general aspect, a 3 dB coupler includes at least one first and one second electric conductor, with each conductor have a winding number of n>1. The at least one first and one second electric conductor are spaced apart from each other and are capacitively and inductively coupled to each other. The first conductor represents a primary side of a transformer, and the second conductor represents a secondary side of a transformer.

The inductance of the conductors can be increased by increasing the number of windings. The inductance increases in square with the number of windings. Doubling of the winding number therefore increases the inductance by a factor of four. The size of an inductance increasing element that can be included in the 3 dB coupler can therefore be decreased by a factor of 4 by doubling the winding number. It is possible to reduce the dimensions by using more than one winding. In the ideal case, further inductance-increasing actions can be omitted by providing a sufficiently large number of windings.

It is also possible to reduce the length of the conductors generating the inductance by increasing the winding number, which advantageously also effects symmetric phase distribution. Ideally, the phase shift between the input signal at one input port and a first output signal of a first output port should be +45° and between the input signal and a second output signal of a second output port −45°. With only one winding being used, a phase shift of for example +40° at one output port as compared to the input port and −50° at the other output port often occurs. When the conductors are shorter, the deviations from the ideal phase distribution are smaller.

The 3 dB coupler can be used for coupling an RF power at a frequency in a range of about 1 to about 80 MHz and at powers of more than about 1 kW. The 3 dB coupler can be used for coupling an RF power at a frequency of approximately 1 MHz; of approximately 2 MHz; of approximately 13.56 MHz; of approximately 27.12 MHz; or of approximately 60 MHz.

The dimensions of the 3 dB coupler for frequencies below 100 MHz can be considerably reduced. The dimension of the 3 dB coupler can be made smaller than $\lambda/4$, where $\lambda$ is a wavelength of the RF signal. The dimension of the 3 dB coupler can be made smaller than $\lambda/8$, and even smaller than $\lambda/10$. With these values, the transmission line theory of radio frequency technology has lower influence. The 3 dB coupler is not a line coupler, as is known from prior art for higher frequencies, i.e., the characteristic of the 3 dB coupler is not (exclusively) determined by the line length of the 3 dB coupler. The coupling between the electric conductors rather corresponds to a capacitive coupling with a fixed, predetermined, set capacitance between the conductors at a predetermined basic frequency f and at a predetermined characteristic wave impedance $Z_0$. The capacitance can be adjusted by way of the surface and the separation between the conductors. The coupling also corresponds to an inductive coupling with a fixed, predetermined, set inductance of the transformer at a predetermined basic frequency f and at a predetermined characteristic wave impedance $Z_0$. The inductance is set, for example, in dependence on the length of the conductors, in particular, of the conductor sections.

In one implementation, at least one inductance increasing element is provided in a coupling region to increase the inductance of the conductors. The values for the inductance and capacitance can be calculated from the above-mentioned formulas in dependence on the frequency and the characteristic wave impedance.

The inductance increasing element may have any shape. It preferably surrounds the conductors in the coupling region at least partially. It may, for example, be parallel to the conductors, thus providing a particularly simple and effective coupling. The inductance increasing element may surround the conductors in the coupling region and may be in the shape of a ring. Ring-shaped means that the conductor sections in the coupling region are surrounded by a substantially closed geometrical form that may be circular, ellipsoidal, rectangular, etc. The ring-shaped geometry may reduce stray fields. A rectangular structure of the ring shape facilitates the dissipation of the heat produced in the inductance increasing element to a cooling body, in particular, a flat cooling plate. In general, the inductance increasing element may include a cooling body, may be connected to a cooling body to thereby exchange heat, or may be formed as a cooling body.

The rectangular structure of the inductance increasing element may include several parts, for example, four cuboids, two U-shaped parts, or one U-shaped part and one cuboid. The constructions in which the inductance increasing element includes several parts facilitates production and moreover, it is possible to provide adjustable gaps between the parts to adjust the inductance.

The at least one inductance increasing element may be formed from a ferritic material. In particular, one or more ferrite rings may be provided, and may surround the conductors at least in sections, preferably in the coupling region.

Depending on the power to be coupled, it is possible to use ferrite rings with relatively high or low magnetic losses. While it is possible to use ferrite rings with relatively high magnetic losses for comparatively small powers, high powers require the use of ferrite material with extremely low magnetic losses. Ferrite bodies with low magnetic losses and identical size usually have lower $A_L$ values (where the $A_L$ value is the inductivity in a coil having a winding of n=1 and its value depends on the material of the coil). For this reason, a correspondingly larger number of ferrite bodies is used to obtain the same inductance.

It is possible to use ferrite rings with an $A_L$ value of, for example, 200 nH for comparatively small loads. For this reason, only a few ferrite rings are required to obtain an inductance of, for example, 600 nH. However, ferrite rings with a smaller $A_L$ value are used for high powers (for example, 5 kW) with correspondingly large currents in the conductors, since otherwise correspondingly high ferromagnetic losses would be produced in the ferrite cores. The magnetic and also the gyromagnetic losses in the ferrite core increase, in dependence on the material, at certain frequencies up to a magnetic resonance frequency. If this ferromagnetic resonance frequency is too low or too close to the operating frequency, the losses may heat the ferrite.

For this reason, a correspondingly higher number of ferrite rings is used, with each ring having a smaller $A_L$ value for high powers. It is therefore possible to realize 90° hybrids having a basic surface of 5 cm×10 cm or smaller for a power of up to 10 kW and an operating frequency of 13.56 MHz. In both cases, the height is approximately 5 cm or less. The higher the winding number, the fewer inductance increasing elements are required. This is desired for a particularly space-saving and inexpensive construction, since the inductance increasing elements aggravate the reproducibility of the inductance.

In one implementation, the first and second conductors each have a winding number of n=2. This winding number represents a compromise, in particular, when an inductance increasing element is used at the same time. The constructive expense for the 3 dB coupler is within tolerable limits. Reproduction of the inductance and capacitance is facilitated and ohmic losses can be reduced. The influence of stray fields can be ignored. If ferrites are used as inductance increasing elements, it is possible to reduce their number or extension to about 25% of the amount that would be required for a winding number of n=1. This saves expensive ferrites. Moreover, the reproducibility is improved when fewer ferrites are used since the ferrite production tolerances of 10-20% are of no consequence.

The production of the inductive transformer of the 3 dB coupler utilizes tight inductive coupling, i.e., at least sections of the primary and secondary lines are as close together as possible. In particular, conductor sections of the primary and secondary sides may overlap or comb. The conductors or conductor sections also may extend parallel to each other at least in sections, preferably in the coupling region.

To obtain a reproducible capacitance, at least one spacer, such as an insulator, may be provided. The spacer keeps sections of the at least one first and the at least one second conductor at a predetermined separation. In one implementation, the conductors extend in parallel planes, at least in sections, preferably in the coupling region.

In accordance with another implementation, flat spacers or insulators may be disposed between neighboring conductor sections. The insulators may be made from an insulating material with an $\epsilon_r$ in the range between 2 and 2.6, and preferably of approximately 2.33, and having a thickness of approximately 0.5 mm to 3 mm. The insulators may extend in the entire coupling region.

To obtain a high Q factor and a high breakdown resistance, the insulating material of the spacers may be polytetrafluoroethylene (PTFE), which is known under the trade name "Teflon". The insulating material has a low loss factor tan $\delta$. Tan $\delta$ may be smaller than 0.005 to reduce the losses in the insulating material. First experiments have shown that RT/duorit 5870 from ROGERS Corp. is particularly suited because it has a tan $\delta$ of 0.0005 to 0.0012 and an $\epsilon_r$ of 2.3.

When the conductors are formed as flat strip conductors at least in the coupling region, one obtains a space-saving arrangement that provides at the same time capacitances that can be easily reproduced.

In this connection, it is advantageous that the at least one spacer has a laminar configuration and one conductor section of the first conductor is disposed on one side of the spacer and one conductor section of the second conductor is disposed on the opposite side of the spacer, wherein a conductor section of the first and second conductors is printed, coated or laminated onto the spacer. The spacer thereby serves as carrier material for the conductors or strip conductors and may be designed as circuit board.

Several of these arrangements may be stacked on top of each other, thereby assuring a defined and constant separation between the conductors or strip conductor, as is mentioned above. It is thereby, in particular, possible to dispose sections of the first and second conductors in the coupling region in a conductor stack, wherein neighboring conductor sections are spaced apart from each other, in particular, by an insulator.

In an advantageous implementation, several spacers, preferably having conductor sections on both sides, in particular circuit boards, are stacked, wherein the conductor sections of opposing sides of neighboring spacers are substantially congruent. The strip conductors having a dielectric as carrier layer can be realized in a simple fashion using a circuit board design and circuit board production.

In one implementation, one first circuit board is provided having a recess that is surrounded by one strip conductor each on the upper and lower sides of the circuit board. At least two substantially T-shaped circuit boards are provided having one strip conductor each on the upper and lower sides. The strip conductors are connected to form two separate windings. The recess can accommodate, for example, an annular ferrite, and the T-pieces can be inserted into the opening of the ferrite.

The operating frequency is not limited to the industrial frequency of 13.56 MHz, but may be in the range between about 1 and about 100 MHz. The 3 dB coupler can be applied for considerably lower frequencies, since the strip conductor sections do not function as line couplers but as coupling capacitances and coupling inductances. If the strip conductors or the strip conductor sections operated as power couplers, at least one line length of $\lambda/4$ would have to be used. Such line lengths are longer, the lower the frequency. This would produce power couplers with increasing sizes. Moreover, the size of the 3 dB coupler is not increased as the frequency is reduced. Only the capacitance and inductance values are adjusted, for example, by influencing the winding number.

Implementations of the 3 dB coupler can include one or more of the following features. For example, the capacitance of the capacitive coupling may be set to a predetermined capacitance value for a predetermined characteristic wave impedance and a predetermined basic frequency, and the inductance of the transformer forming the inductive coupling may be set to a predetermined inductance value for a predetermined characteristic wave impedance and a predetermined basic frequency. The first and second conductors may each have a winding number of n=2.

The 3 dB coupler may include at least one inductance increasing element provided in a coupling region to increase the inductance of the first and second conductors. The at least one inductance increasing element may at least partially surround the first and second conductors in the coupling region. The at least one inductance increasing element may have an annular shape. The at least one inductance increasing element may include at least one adjustable gap. The at least one inductance increasing element may be formed from a ferritic material. The first and second conductors may extend, at least in sections, parallel to each other in the coupling region. The first and second conductors may extend, at least in sections, in parallel planes preferably in the coupling region.

The length of the at least one first and/or second conductor may be $<\lambda/4$, where $\lambda$ is the wavelength of the electromagnetic signal through the 3 dB coupler. In particular, the length of the at least one first and/or second conductor may be $<\lambda/8$ or $<\lambda/10$. For example, for wavelengths $\lambda$ in the range of about 1 mm to about 1 m, the length of the conductors in the 3 dB coupler can be about $\lambda/4$.

The conductors may extend, at least in sections, parallel to each other. The conductors may extend, at least in sections, in parallel planes. The 3 dB coupler may include at least one spacer that keeps sections of the at least one first and the at least one second conductor at a predetermined separation. The at least one spacer may be formed as an electric insulator that extends in the entire coupling region. The conductors may be designed as flat strip conductors at least in the coupling region. The at least one spacer may have a laminar configuration and one conductor section of the first conductor may be disposed on one side of the spacer and one conductor section of the second conductor may be disposed on the opposite side of the spacer. The conductor section of the first and second conductor may be printed, coated, or laminated on the spacer. Sections of the first and second conductors may be disposed in the coupling region in a conductor stack, wherein neighboring conductor sections are separated from each other by an insulator. Several spacers that are preferably provided on both sides with conductor sections may be stacked, wherein the conductor sections of opposing sides of neighboring spacers may be substantially congruent.

The inductance increasing element may include a cooling body to which heat is exchanged. The inductance increasing element may be in contact with a cooling body to which heat is exchanged. The inductance increasing element may be a cooling body.

The 3 dB coupler may include a first circuit board having a recess that is surrounded by a strip conductor on each of upper and lower sides of the first circuit board, and at least two substantially T-shaped circuit boards that each include a strip conductor on each of upper and lower sides of the respective T-shaped circuit boards. The strip conductors of the circuit boards may be connected to form two separate windings.

The 3 dB coupler realizes good capacitive and inductive coupling of the primary and secondary sides of the transformer, and has relatively small dimensions because, among other features, the 3 dB coupler does not use discrete components.

Further features and advantages can be extracted from the following description, from the figures, and from the claims. The individual features may be realized individually or collectively in arbitrary combination.

DESCRIPTION OF DRAWINGS

Like reference symbols in the various drawings may indicate like elements.

DETAILED DESCRIPTION

Figure 1A:
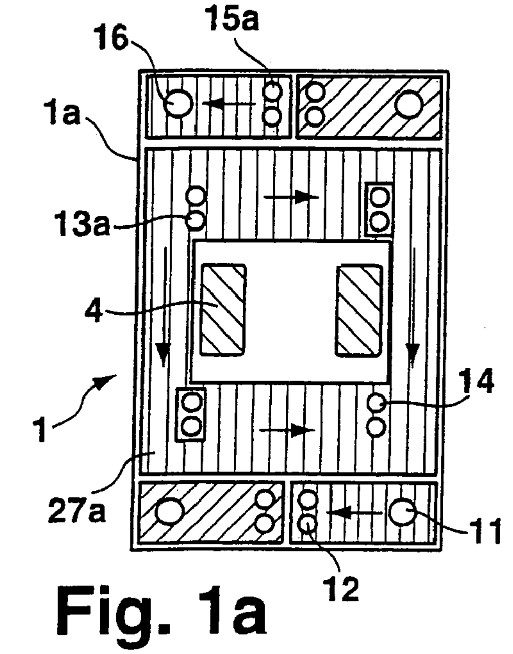
FIG. 1*a* shows an upper side of a first circuit board that is part of a 3 dB coupler.

Radio frequency amplifiers of larger power can be formed with transistor output stages. The use of transistorized amplifiers has increased the use of switched amplifiers that operate in a resonant mode. The transistors are thereby switched to produce a minimum amount of lost energy. In this manner, it is possible to construct amplifiers having relatively small dimensions and a comparatively large power. It is possible to construct 13.56 MHz 3 kW amplifiers of a size of approximately 0.3 m×0.2 m×0.2 m. Integration of these amplifiers into plasma systems or into laser excitation arrangements is facilitated due to their smaller size.

Transistorized output stages can produce great power by interconnecting several synchronously running radio frequency amplifiers. They are interconnected by way of so-called combiners. There are different types of construction of such combiners.

A combiner that is frequently used in microwave technology or radio transmission technology is the so-called 90° hybrid, which is also called a 3 dB coupler. The 3 dB coupler is a four-port device. When the 3 dB coupler is used as a combiner, two radio frequency power amplifiers having identical inner resistances, identical output frequencies, and output signals that are phase-shifted by 90° are connected to one port each. A load with a load resistance is connected to a third port. A load compensating resistance is connected to a fourth port. The load resistance, the load compensating resistance, and the inner resistances of the amplifier are the same. The exclusively passive components of the 90° hybrid (lines, capacitances, transformer, or inductances) are designed such that the power of the two amplifiers is combined at the load, no power is dissipated at the load compensating resistance, and the two amplifiers are decoupled and cannot influence each other. The 90° hybrid itself is loss-free in the ideal case, i.e., the whole power of the two radio frequency amplifiers is supplied to the load present at the third port.

The 3 dB couplers used in microwave technology can be constructed as line couplers having line lengths of $\lambda/4$, where $\lambda$ is a wavelength of the microwave signal. The use of this line coupling technology for 13 and 27 MHz would be unfavorable, since the size of 3 dB couplers for $\lambda/4$ lengths would be several meters, which would be a step backwards in view of the desired miniaturization of the generators.

Alternatively, a 3 dB coupler can be constructed from discrete components, wherein the 3 dB coupler generally includes at least one capacitance for capacitive coupling and one transformer with a coupling inductance for inductive magnetic coupling. The coupling inductance and the coupling capacitance of the 3 dB coupler meets the following conditions:

$L_{K=Z0}/(2\pi f)$ and $C_K=1/(2\pi f Z_0)$, where:

$L_K$=coupling inductance, $C_K$=coupling capacitance, $Z_0$=characteristic wave impedance, and f=frequency.

For example, at a frequency of 13 MHz and an impedance $Z_0=50\Omega$, the coupling inductance $L_K$ is approximately 600 nH, and the coupling capacitance $C_K$ is approximately 200 pF.

The construction of a 3 dB coupler from discrete components can require great expense of accurate components, which may be additionally matched. This can be expensive, in particular, for large powers (for example, powers larger than about 1 kW).

The coupling capacitance can be realized in a simple and inexpensive manner and can be reproduced with precision by using two spaced-apart electric conductors each having a defined surface and a defined separation from each other. The inductance is, however, mostly not obtained by using two such conductors. For this reason, the inductance can be increased in a suitable manner. For example, the inductance can be increased exclusively with inductance increasing elements, i.e., ferrites. To obtain the inductance for large powers, large and expensive inductance increasing elements may be required.

Figure 1B:
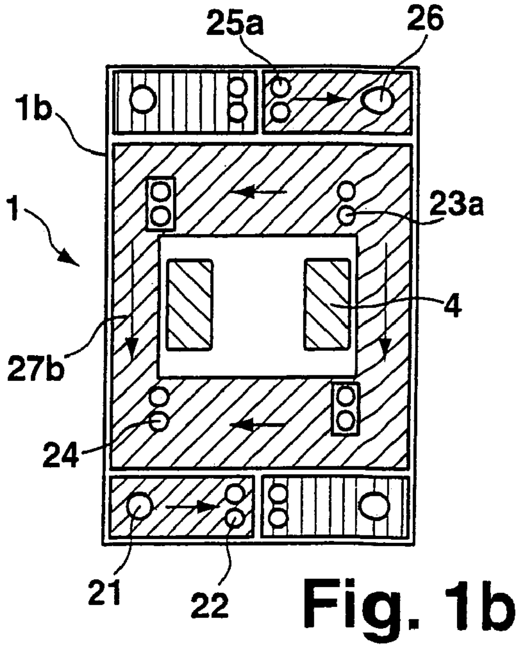
FIG. 1*b* shows a lower side of the first circuit board of FIG. 1*a*.
Figure 2A:
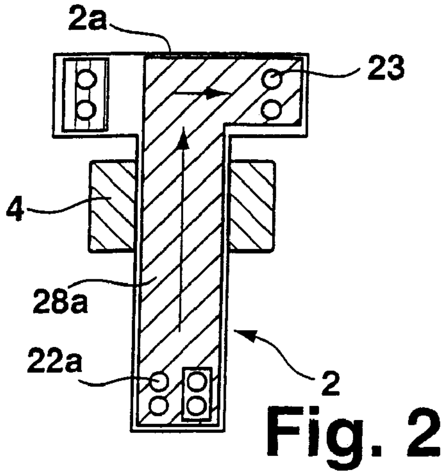
FIG. 2*a* shows an upper side of a second circuit board to be disposed above the first circuit board of FIG. 1*a;*
Figure 2B:
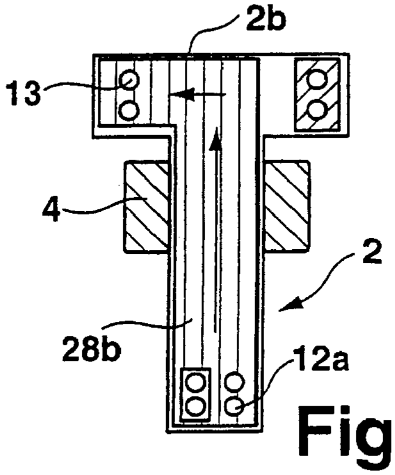
FIG. 2*b* shows a lower side of the second circuit board of FIG. 2*a;*
Figure 3A:
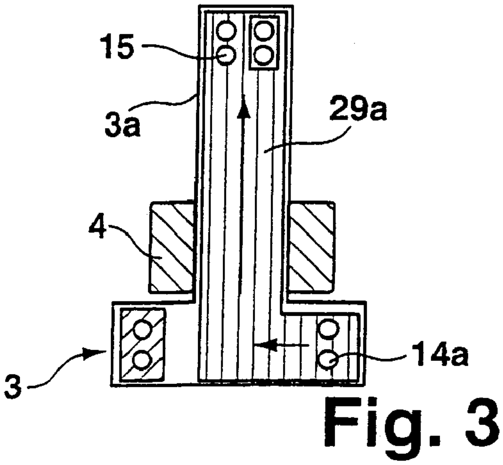
FIG. 3*a* shows an upper side of a third circuit board to be disposed above the second circuit board of FIG. 2*a;*
Figure 3B:
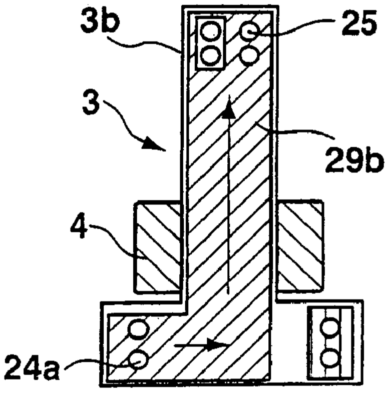
FIG. 3*b* shows a lower side of the third circuit board of FIG. 3*a;*
Figure 4:
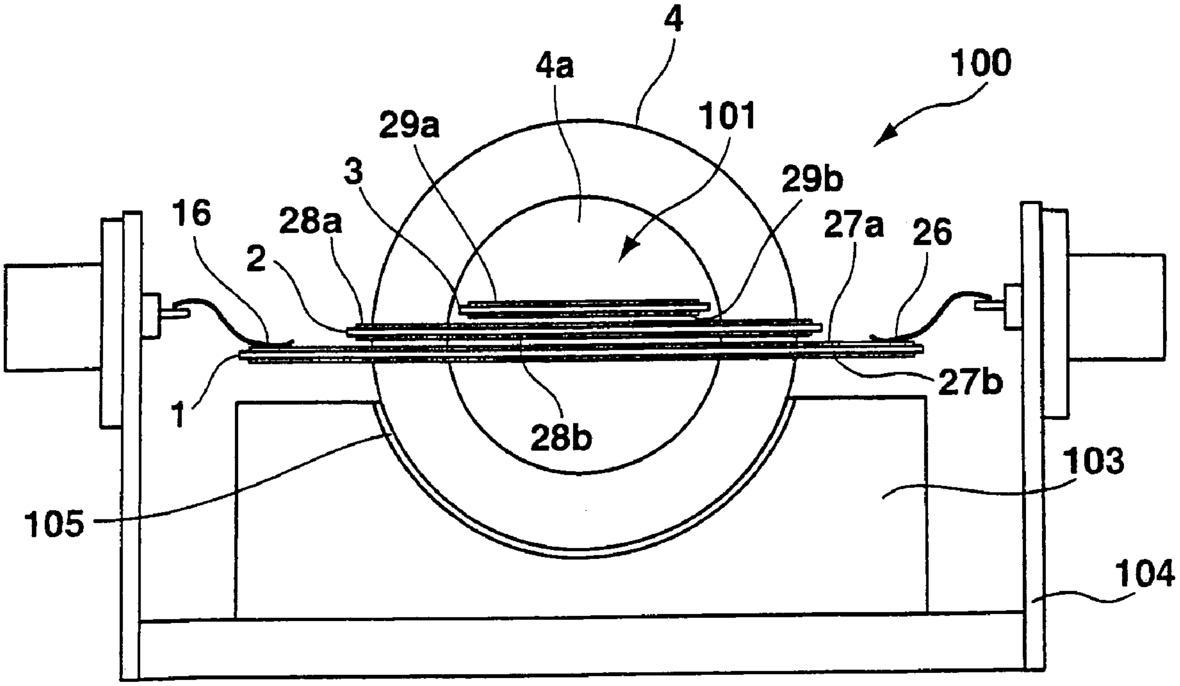
FIG. 4 shows a front view of an implementation of a 3 dB coupler.

FIGS. 1*a*, 1*b* show an upper side 1*a* and a lower side 1*b*, respectively, of a first circuit board 1. FIGS. 2*a*, 2*b* show an upper side 2*a* and a lower side 2*b* of a second circuit board 2. FIGS. 3*a*, 3*b* show an upper side 3*a* and a lower side 3*b* of a third circuit board 3. The circuit boards 1, 2, 3 form a 3 dB coupler 100, as is shown in FIG. 4. In general, the 3 dB coupler 100 includes at least one first and one second electric conductor that are spaced apart from each other, and are capacitively and inductively coupled to each other. The first electric conductor represents the primary side, and the second electric conductor represents the secondary side of a transformer.

Connections 11, 16, 21, 26 of the circuit board 1 are the inputs and outputs (ports) of the 3 dB coupler 100. Connections 12 and 12*a* are congruent when the circuit boards 1 and 2 are disposed on top of each other, and are connected in an electrically conducting manner when the 3 dB coupler 100 is assembled. Additionally, connections 13, 13*a*; 14, 14*a*; 15, 15*a*; 22, 22*a*; 23, 23*a*; 24, 24*a* and 25, 25*a* are congruent with each other in the same manner as the connections 12 and 12*a*.

The 3 dB coupler 100 includes a transformer having a primary side and a secondary side. The inductance of the primary side (shown as perpendicular hatched surfaces in FIGS. 1*a*-3*b*) includes two windings that extend through an inductance increasing element 4, which is formed as ferrite. The path of the two windings of the primary side is explained by reference numerals and arrows in FIGS. 1*a*-3*b*. The primary side inductance extends from connection 11 to connection 12, further to connection 12*a*, to connection 13, to connection 13*a*, to connection 14, to connection 14*a*, to connection 15, then to connection 15*a*, and finally to connection 16.

The inductance of the secondary side (shown as inclined hatched surfaces in FIGS. 1*a*-3*b*) also extends in two windings through the inductance increasing element 4, i.e., from connection 21 to connection 22, further to connection 22*a*, then to connection 23, to connection 23*a*, to connection 24, to connection 24*a*, further to connection 25, to connection 25*a*, and finally to connection 26.

In the 3 dB coupler design 100 (FIG. 4), the circuit board 2 is disposed on the circuit board 1 and the circuit board 3 is disposed on the circuit board 2. The capacitance is thus formed substantially only between the conducting surfaces of the upper side 1*a*, 2*a*, 3*a* and lower side 1*b*, 2*b*, 3*b* of one circuit board 1, 2, 3, respectively. The upper side 1*a* of the circuit board 1 and the lower side 2*b* of the circuit board 2 have strip conductors 27*a*, 28*b* of the same inductance and the upper side 2*a* of the circuit board 2 and the lower side 3*b* of the circuit board 3 have strip conductors 28*a*, 29*b* of the other inductance. Since a voltage is formed over the inductance, the circuit boards 1, 2, 3 are separated from each other, for example, through spacers, such as insulating plates or sheets. The overall arrangement of the three circuit boards 1, 2, 3 can also be integrated into a multi-layer (in the present case six layers) circuit board that permits more precise production at lower cost. The inductance increasing elements 4 are inserted in the form of two semi-shells.

A 3 dB coupler 100 can thereby be formed to combine two times 2.5 kW RF power at 13.56 MHz at 5 kW with dimensions of a length of 10 cm and a width of 5 cm (circuit board 1) and 4 cm height (determined by the inductance increasing element 4 designed as ferrite ring).

If the capacitance is to be matched or increased, a discrete capacitor can be connected in parallel, or the surface on both sides, for example, on the circuit board 1 can be increased.

FIG. 4 shows the arrangement of circuit boards 1, 2, 3 relative to the 3 dB coupler 100. The connections 16, 26 are shown. The circuit boards 2, 3 are disposed above the circuit board 1, wherein the T-shaped circuit boards 2, 3 are inserted into a space 4*a* of the inductance increasing element 4. This means that a coupling region 101 is surrounded by the inductance increasing element 4. The circuit boards 1, 2, 3 have strip conductors 27*a*, 27*b*, 28*a*, 28*b*, 29*a*, 29*b* on their upper sides 1*a*, 2*a*, 3*a* and lower sides 1*b*, 2*b*, 3*b*. The strip conductors 27*a*, 27*b*, 28*a*, 28*b*, 29*a*, 29*b* on different sides of a circuit board 1, 2, 3 are separated by the carrier material of the circuit board 1, 2, 3. The carrier material is an insulator and serves as spacer. The opposing strip conductor sections of neighboring circuit boards 1, 2, 3 are separated by spacers. The inductance increasing element 4 is disposed on a cooling body 103, which is in turn seated on a carrier plate 104. A layer 105 that improves the thermal conductance is disposed between the cooling body 103 and the inductance increasing element 4.

Figure 5:
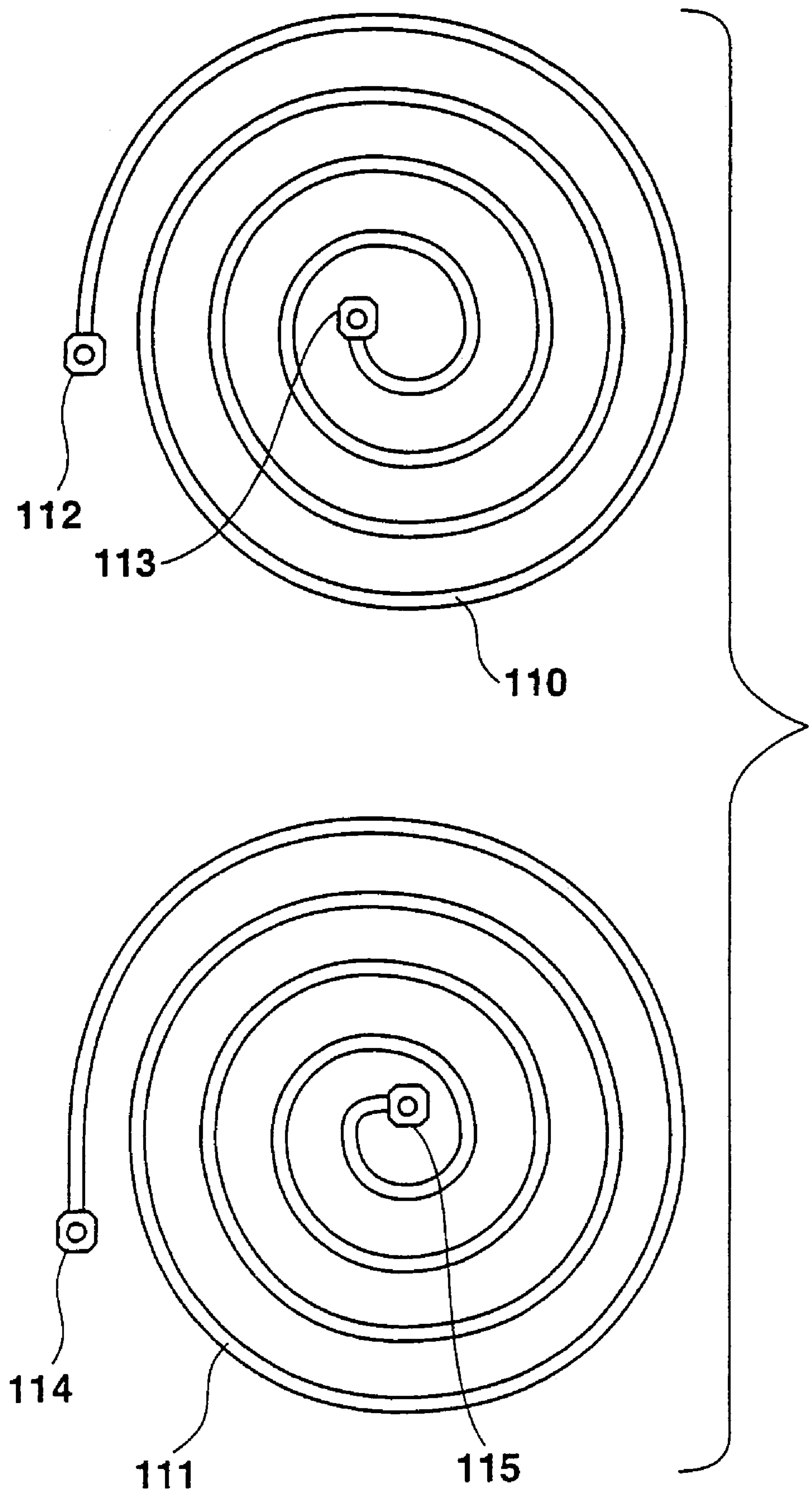
FIG. 5 shows a further implementation of a 3 dB coupler.

FIG. 5 shows an implementation of a 3 dB coupler without an inductance increasing element. The conductors 110, 111 designed as strip conductors are formed as spirals. The spirals of conducting material are disposed, for example, laminated, on both sides of a circuit board. A conductor 110 is thereby disposed on the upper side and a conductor 111 is disposed on the lower side of the circuit board to largely coincide. The conductors 110, 111 represent, respectively, the inductances of the primary side and the secondary side of a transformer of a 3 dB coupler. They have a winding number of n=4 each.

When the connections 112-115 are desired in the form of through connections, they are offset, as shown in FIG. 5. It is, however, also feasible to form the connections 112-115 both on the upper and lower side of the circuit board, and to dispose the 3 dB coupler, for example, between two amplifiers.

In this case, it is also possible to use an inductance increasing element made of, for example, a ferrite, for example in the form of a disc, pin or shell core. If necessary, a recess, for example a bore for a ferrite must be provided in the center of the spiral.

Other implementations are within the scope of the following claims.

What is claimed is:

1. A 3 dB coupler comprising at least one first and one second electric conductor that are spaced apart from each other and are capacitively and inductively coupled to each other, wherein the first conductor represents the primary side and the second conductor represents the secondary side of a transformer, wherein the first and second conductor each have a winding number of n>1, and wherein the length of the at least one first and/or second conductor is <λ/4, where λ is the wavelength of the electromagnetic signal to be used with the 3 dB coupler.

2. The 3 dB coupler of claim 1, wherein the first and second conductors each have a winding number of n=2.

3. The 3 dB coupler of claim 1, wherein the first and second electric conductors are capacitively and inductively coupled in a coupling region.

4. The 3 dB coupler of claim 3, wherein the first and second conductors extend, at least in sections, parallel to each other in the coupling region.

5. The 3 dB coupler of claim 3, wherein the first and second conductors extend, at least in sections, in parallel planes preferably in the coupling region.

6. The 3 dB coupler of claim 3, wherein the conductors are designed as flat strip conductors at least in the coupling region.

7. The 3 dB coupler of claim 3, further comprising at least one spacer that keeps sections of the at least one first and the at least one second conductor at a predetermined separation.

8. The 3 dB coupler of claim 7, wherein the at least one spacer is formed as an electric insulator that extends in the entire coupling region.

9. The 3 dB coupler of claim 7, wherein the at least one spacer has a laminar configuration and one conductor section of the first conductor is disposed on one side of the spacer and one conductor section of the second conductor is disposed on the opposite side of the spacer.

10. The 3 dB coupler of claim 9, wherein a conductor section of the first and second conductor is printed, coated, or laminated on the spacer.

11. The 3 dB coupler of claim 9, wherein sections of the first and second conductors are disposed in the coupling region in a conductor stack, wherein neighboring conductor sections are separated from each other by an insulator.

12. The 3 dB coupler of claim 9, wherein several spacers that are preferably provided on both sides with conductor sections are stacked, wherein the conductor sections of opposing sides of neighboring spacers are substantially congruent.

13. The 3 dB coupler of claim 1, wherein the length of the at least one first and/or second conductor is <λ/8.

14. The 3 dB coupler of claim 1, wherein the length of the at least one first and/or second conductor is <λ/10.

15. The 3 dB coupler of claim 1, wherein the conductors extend, at least in sections, parallel to each other.

16. The 3 dB coupler of claim 1, wherein the conductors extend, at least in sections, in parallel planes.

17. A 3 dB coupler comprising at least one first and one second electric conductor that are spaced apart from each other and are capacitively and inductively coupled to each other, wherein the first conductor represents the primary side and the second conductor represents the secondary side of a transformer, wherein the first and second conductor each have a winding number of n>1, and wherein the capacitance of the capacitive coupling is set to a predetermined capacitance value for a predetermined characteristic wave impedance and a predetermined basic frequency, and the inductance of the transformer forming the inductive coupling is set to a predetermined inductance value for a predetermined characteristic wave impedance and a predetermined basic frequency.

18. The 3 dB coupler of claim 17, wherein the first and second electric conductors are capacitively and inductively coupled in a coupling region.

19. The 3 dB coupler of claim 17, wherein the conductors extend, at least in sections, parallel to each other.

20. The 3 dB coupler of claim 17, wherein the conductors extend, at least in sections, in parallel planes.

21. A 3 dB coupler comprising:

at least one first and one second electric conductor that are spaced apart from each other and are capacitively and inductively coupled to each other, wherein the first conductor represents the primary side and the second conductor represents the secondary side of a transformer, and wherein the first and second conductor each have a winding number of n>1; and at least one inductance increasing element provided in a coupling region to increase the inductance of the first and second conductors.

22. The 3 dB coupler of claim 21, wherein the at least one inductance increasing element at least partially surrounds the first and second conductors in the coupling region.

23. The 3 dB coupler of claim 21, wherein the at least one inductance increasing element has an annular shape.

24. The 3 dB coupler of claim 21, wherein the at least one inductance increasing element comprises at least one adjustable gap.

25. The 3 dB coupler of claim 21, wherein the at least one inductance increasing element is formed from a ferritic material.

26. The 3 dB coupler of claim 21, wherein the inductance increasing element includes a cooling body to which heat is exchanged.

27. The 3 dB coupler of claim 21, wherein the inductance increasing element is in contact with a cooling body to which heat is exchanged.

28. The 3 dB coupler of claim 21, wherein the inductance increasing element is a cooling body.

29. The 3 dB coupler of claim 21, wherein the length of the at least one first and/or second conductor is <λ4, where λ is the wavelength of the electromagnetic signal to be used with the 3 dB coupler.

30. The 3 dB coupler of claim 21, wherein the first and second electric conductors are capacitively and inductively coupled in a coupling region.

31. The 3 dB coupler of claim 21, wherein the conductors extend, at least in sections, parallel to each other.

32. The 3 dB coupler of claim 21, wherein the conductors extend, at least in sections, in parallel planes.

33. A 3 dB coupler comprising:

at least one first and one second electric conductor that are spaced apart from each other and are capacitively and inductively coupled to each other, wherein the first conductor represents the primary side and the second conductor represents the secondary side of a transformer, and wherein the first and second conductor each have a winding number of n>1, a first circuit board comprising a recess that is surrounded by a strip conductor on each of upper and lower sides of the first circuit board, and at least two substantially T-shaped circuit boards that each comprise a strip conductor on each of upper and lower sides of the respective T-shaped circuit boards, wherein the strip conductors of the circuit boards are connected to form two separate windings.

34. The 3 dB coupler of claim 33, wherein the first and second electric conductors are capacitively and inductively coupled in a coupling region.

35. The 3 dB coupler of claim 33, wherein the conductors extend, at least in sections, parallel to each other.

36. The 3 dB coupler of claim 33, wherein the conductors extend, at least in sections, in parallel planes.

37. A method for coupling RF power at a frequency in the range between about 1 and about 80 MHz and at powers of more than about 1 kW, the method comprising:

forming a first electric conductor in a spiral having at least one winding;

forming a second electric conductor in a spiral having at least one winding;

spacing apart the first electric conductor from the second electric conductor;

capacitively and inductively coupling the first electric conductor and the second electric conductor;

arranging the first electric conductor as a primary side of a transformer; and arranging the second electric conductor as a secondary side of the transformer;

wherein the RF power is at a frequency of about 1; 2; 13.56; 27.12; or 60 MHz.

* * * * *